(12) United States Patent
Fukai et al.

(10) Patent No.: US 9,810,746 B2
(45) Date of Patent: Nov. 7, 2017

(54) MAGNETIC SENSOR

(71) Applicant: Seiko Instruments Inc., Chiba-shi, Chiba (JP)

(72) Inventors: Kentaro Fukai, Chiba (JP); Minoru Ariyama, Chiba (JP); Tomoki Hikichi, Chiba (JP); Takemasa Miura, Chiba (JP)

(73) Assignee: SII Semiconductor Corporation (JP)

( * ) Notice: Subject to any disclaimer, the term of this patent is extended or adjusted under 35 U.S.C. 154(b) by 147 days.

(21) Appl. No.: 14/742,940

(22) Filed: Jun. 18, 2015

(65) Prior Publication Data
US 2015/0377647 A1 Dec. 31, 2015

(30) Foreign Application Priority Data

Jun. 27, 2014 (JP) .................. 2014-133275

(51) Int. Cl.
*G01R 33/07* (2006.01)
*G01R 33/00* (2006.01)

(52) U.S. Cl.
CPC ......... *G01R 33/07* (2013.01); *G01R 33/0029* (2013.01)

(58) Field of Classification Search
CPC ...... G01R 33/06; G01R 33/09; G01R 33/091; G01R 33/07; G01R 33/072; G01R 33/0029; G01D 5/142; G01D 5/145
See application file for complete search history.

(56) References Cited

U.S. PATENT DOCUMENTS

| 5,488,296 | A | * | 1/1996 | Hancock | G01R 33/07 324/207.12 |
| 5,550,469 | A | * | 8/1996 | Tanabe | G01R 33/06 324/225 |
| 5,896,028 | A | * | 4/1999 | Arai | G01R 15/185 324/117 H |
| 9,013,167 | B2 | * | 4/2015 | Antonacci | G01R 33/0029 323/294 |
| 2002/0021126 | A1 | * | 2/2002 | Ishibashi | G01D 3/036 324/251 |

FOREIGN PATENT DOCUMENTS

JP          10-239410 A     9/1998

* cited by examiner

*Primary Examiner* — David M. Schindler
(74) *Attorney, Agent, or Firm* — Brinks Gilson & Lione

(57) ABSTRACT

To provide a magnetic sensor which is reduced in power consumption without reducing magnetism detection sensitivity of a magnetoelectric transducing element. One end of a magnetoelectric transducing element is connected to an output electrode of a constant current circuit, and the other end thereof is connected to a power supply electrode on the positive side of one or plural signal processing circuits, and the like built in a magnetic sensor, whereby a connection relation of the magnetoelectric transducing element and the signal processing circuit is configured such that they are connected in series with a voltage source.

3 Claims, 6 Drawing Sheets

MAGNETIC SENSOR

RELATED APPLICATIONS

This application claims priority under 35 U.S.C. §119 to Japanese Patent Application No. 2014-133275 filed on Jun. 27, 2014, the entire content of which is hereby incorporated by reference.

BACKGROUND OF THE INVENTION

Field of the Invention

The present invention relates to a magnetic sensor which converts a magnetic flux density to an electric signal.

Background Art

As a sensor which detects the position, distance, rotation and the like related to a magnetic field generating member in an electronic apparatus, there are currently widely known magnetic sensors each using a Hall element corresponding to a magnetoelectric transducing element. Even among those, a magnetic sensor having a Hall element and a signal processing circuit built therein has the potential for being capable of being provided as a magnetic sensor having high performance and high function by providing therein optimal signal processing means matched with electromagnetic conversion characteristics peculiar to the Hall element, and has been advanced in development.

The Hall element has the intrinsic characteristics depending on the material, structure, size and the like, but gets such magnetoelectric conversion characteristics as shown below approximately. When a magnetic field having a magnetic flux density B is vertically applied to the sensitive surface of the Hall element, an output signal VO of the Hall element is proportional to the magnetic flux density B. KH corresponding to a proportional coefficient in an equation (1) indicates magnetism detection sensitivity of the Hall element. Further, the magnetism detection sensitivity KH is proportional to a drive current IH of the Hall element. Accordingly, the Hall element leads to the realization of high sensitivity by feeding more drive current thereto.

$$VO = KH \times B \quad (1)$$

$$KH \propto IH \quad (2)$$

FIG. 2 is a conceptual diagram illustrating a related art magnetic sensor. The magnetic sensor 200 illustrated in FIG. 2 is configured by a constant current circuit 2, a Hall element 3, and a signal processing circuit 4. The Hall element 3 is driven by a voltage source 1 through the constant current circuit 2. The signal processing circuit 4 driven by the voltage source 1 is connected with two output electrodes 3b and 3d of the Hall element 3. A signal outputted from the Hall element 3 is outputted to an external terminal OUT through the signal processing circuit 4.

Thus, it is common that a connection relationship of a power supply in the related art magnetic sensor 200 takes the form of the Hall element 3 and the signal processing circuit 4 being connected in parallel with the voltage source 1. A value obtained by adding the current consumption of the Hall element 3 and the current consumption of the signal processing circuit 4 results in the current consumption of the magnetic sensor 200.

[Patent Document 1] Japanese Patent Application Laid-Open No. Hei 10(1988)-239410

SUMMARY OF THE INVENTION

As the characteristics required of a magnetic sensor, may be mentioned high sensitization capable of responding to a small magnetic field applied thereto, a reduction in power consumption, etc. In order to achieve the high sensitization of the magnetic sensor, the magnetism detection sensitivity of a Hall element bearing magnetoelectric transducing means also becomes an important key. Allowing the Hall element to obtain high sensitization as described above is a trade-off relationship with the reduction in power consumption, and hence compatibility between the two becomes a problem. In particular, since various circuits other than a Hall element consume current in a magnetic sensor having built therein a signal processing circuit capable of providing high performance and high functionality, the current consumption of the entire magnetic sensor may increase.

In order to solve such a problem, there is provided a magnetic sensor having built therein a Hall element and a signal processing circuit, in which as for connection destinations to two drive electrodes of the Hall element, one end of the Hall element is electrically connected to an output electrode of a constant current circuit and the other end thereof is connected to a power supply electrode V1 on the positive side of one or plural signal processing circuits built in the magnetic sensor to bring a connection relationship of the Hall element and the signal processing circuit to a form in which they are connected in series with a voltage source, whereby the signal processing circuit is driven using as its current consumption, part or all of a drive current of the Hall element.

According to the magnetic sensor of the present application, a reduction in power consumption of the magnetic sensor is made possible without lowering the magnetism detection sensitivity of a magnetoelectric transducing element.

DESCRIPTION OF THE PREFERRED EMBODIMENTS

Preferred embodiments of the present invention will hereinafter be described with reference to the accompanying drawings.

First Embodiment

Figure 1:
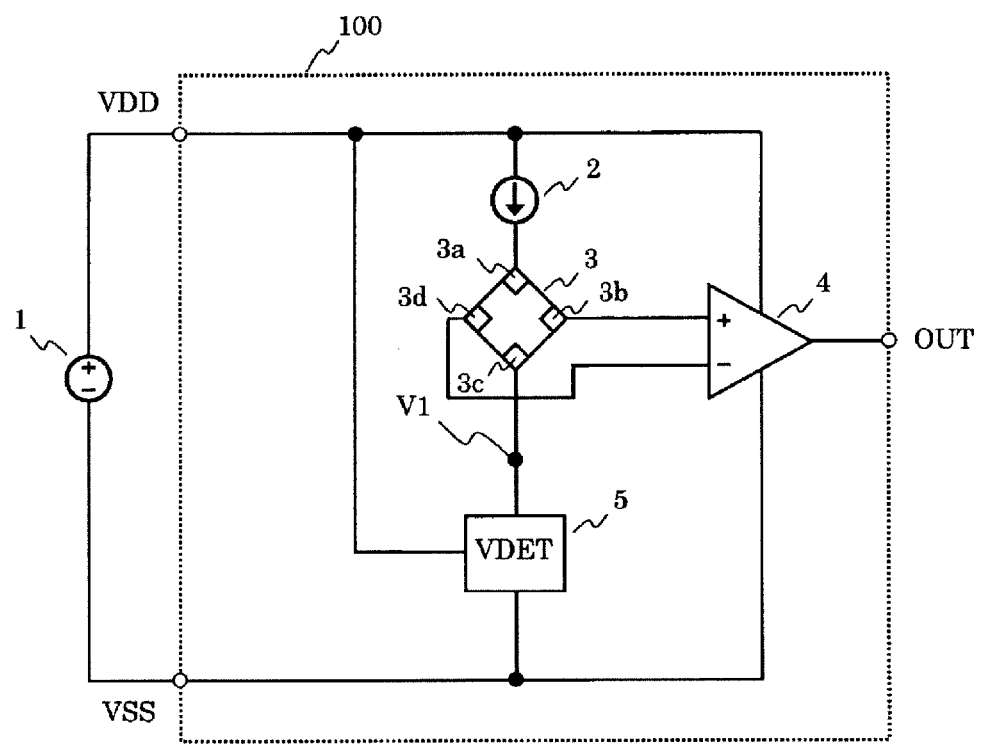
FIG. 1 is a conceptual diagram illustrating a magnetic sensor according to a first embodiment.
Figure 2:
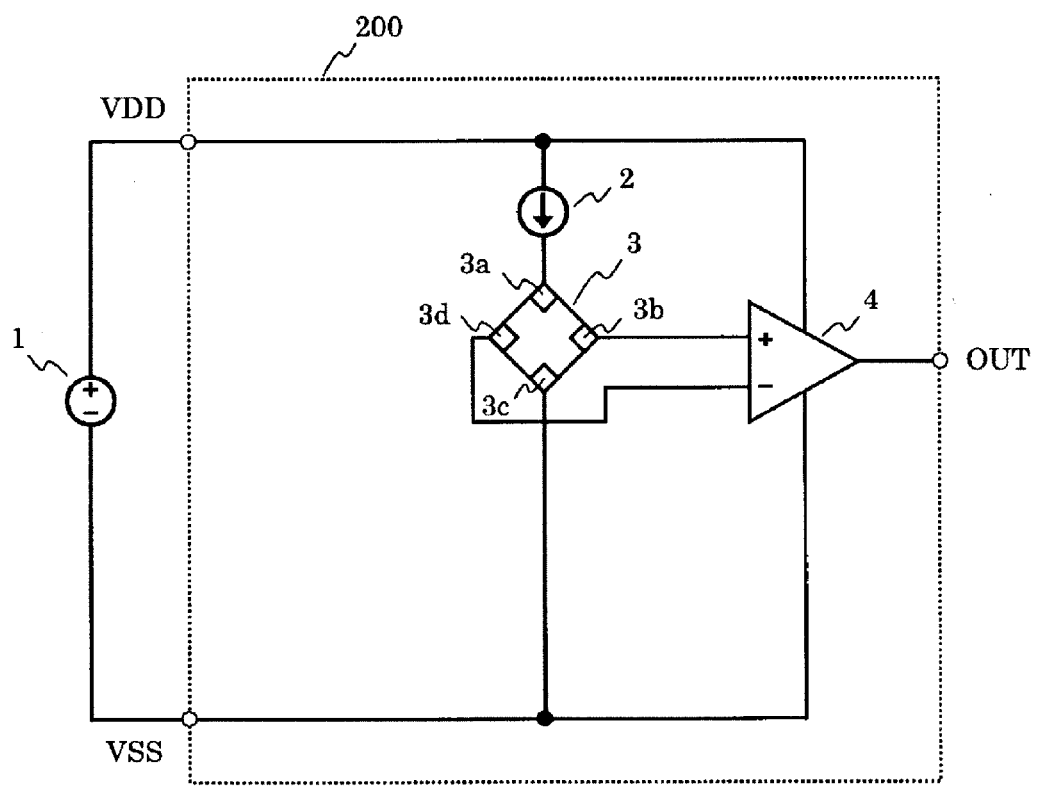
FIG. 2 is a conceptual diagram illustrating a related art magnetic sensor.

FIG. 1 is a conceptual diagram illustrating a first embodiment of a magnetic sensor according to the present invention.

The magnetic sensor 100 has power supply electrodes VDD and VSS to which a voltage source 1 is connected, and has an output electrode OUT which outputs an electric signal to the outside. The magnetic sensor 100 is equipped with a constant current circuit 2, a Hall element 3 which is a magnetoelectric transducing element, a signal processing circuit 4, and a voltage detecting circuit 5.

The constant current circuit 2 is driven by the voltage source 1 to supply a constant current IB to a drive electrode 3a of the Hall element 3.

The Hall element 3 has two drive electrodes and two output electrodes. Of the drive electrodes 3a and 3c, the drive electrode 3a is connected to an output electrode of the constant current circuit 2, and the drive electrode 3c is connected only to a power supply electrode V1 on the positive side of the voltage detecting circuit 5. The voltage detecting circuit 5 has a power supply electrode on the negative side thereof, which is connected to the power supply electrode VSS.

The voltage detecting circuit 5 is a circuit which monitors, for example, the voltage of a power supply voltage in the magnetic sensor.

Thus, the constant current circuit 2, the Hall element 3, and the voltage detecting circuit 5 take the form of being connected in series with the voltage source 1. The constant current IB is equal to a drive current IH of the Hall element 3 and to a current consumption IX1 of the voltage detecting circuit 5.

The output electrodes 3b and 3d of the Hall element 3 are connected to their corresponding two input electrodes of the signal processing circuit 4. An output signal of the Hall element 3, i.e., an electric signal proportional to a magnetic flux density of a component in the direction vertical to the sensitive surface of the Hall element 3, of magnetic flux density vectors applied to the Hall element 3 is inputted to the signal processing circuit 4.

The signal processing circuit 4 is a circuit for converting the output signal of the Hall element 3 to a desired electric signal, e.g., an operational amplifier which amplifies the output signal of the Hall element 3. The signal processing circuit 4 may include a comparator and a reference voltage generator. Further, the signal processing circuit 4 may include a reference current circuit used thereinside. A power supply electrode on the positive side of the signal processing circuit 4 is connected to the power supply electrode VDD, and a power supply electrode on the negative side thereof is connected to the power supply electrode VSS. Thus, a current IY consumed in the signal processing circuit 4 takes a current path different from that for the current IX1 consumed in the voltage detecting circuit 5.

As described above, in the magnetic sensor 100 with the voltage source 1 as the reference, two systems are provided as main current systems. One of them is a system in which the constant current circuit 2, the Hall element 3, and the voltage detecting circuit 5 are electrically connected in series. The current consumption of this system is equal to IH. The other current system is a system of the signal processing circuit 4. The current consumption thereof is equal to IY. Accordingly, the current consumption of the entire magnetic sensor is equal to IH+IY.

Thus, there can be realized a magnetic sensor which allows the required amount of drive current to flow through the Hall element 3, and reduces the total current consumption without adding the current consumption IX1 of the voltage detecting circuit 5.

Second Embodiment

Figure 3:
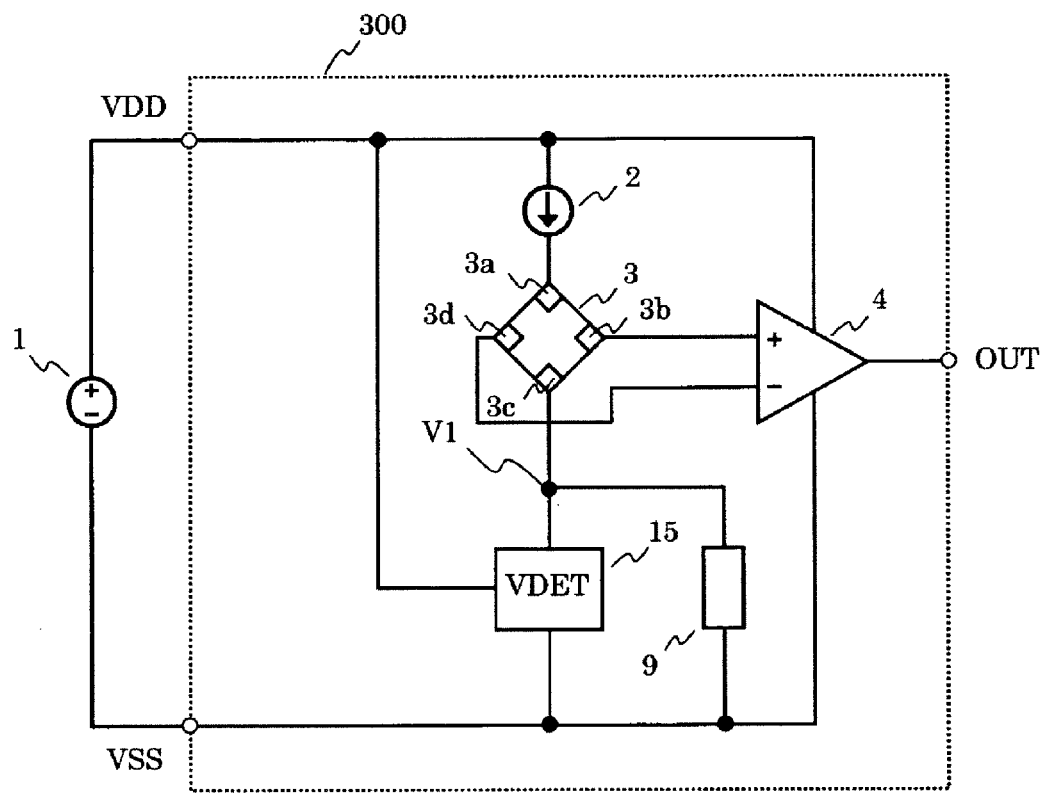
FIG. 3 is a conceptual diagram illustrating a magnetic sensor according to a second embodiment.

FIG. 3 is a conceptual diagram illustrating a second embodiment of a magnetic sensor according to the present invention.

The magnetic sensor 300 according to the second embodiment is equipped with a voltage detecting circuit 15 and a shunt 9 instead of the voltage detecting circuit 5 of the magnetic sensor 100 according to the first embodiment.

The second embodiment is an example equipped with means which emits an extra current IZ2 to a power supply electrode VSS using the shunt 9 when a current consumption IX2 of the voltage detecting circuit 15 is smaller than a drive current IH of a Hall element 3.

Parts identical in component to the first embodiment are similar in connection relation and operation to the first embodiment.

Of drive electrodes 3a and 3c of the Hall element 3, the drive electrode 3c is connected to a power supply electrode V1 on the positive side of the voltage detecting circuit 15, and the shunt 9.

The shunt 9 can be substituted with, for example, a resistive element, a diode, a constant current circuit or the like. A power supply electrode on the negative side of the shunt 9 is connected to the power supply electrode VSS.

As described above, in the magnetic sensor 300 with a voltage source 1 as the reference, two systems are provided as main current systems. One of the systems is a system in which a constant current circuit 2 and the Hall element 3 are electrically connected in series, and further a parallel circuit of the voltage detecting circuit 15 and the shunt 9 is connected in series. The current consumption of this system is equal to IH. The other thereof is a system of a signal processing circuit 4. The current consumption of the system is equal to IY. Accordingly, the current consumption of the entire magnetic sensor is equal to IH+IY.

Thus, there can be realized a magnetic sensor which allows a required amount of drive current to flow through the Hall element 3, and reduces the total current consumption without adding the current consumption IX2 of the voltage detecting circuit 15.

Third Embodiment

Figure 4:
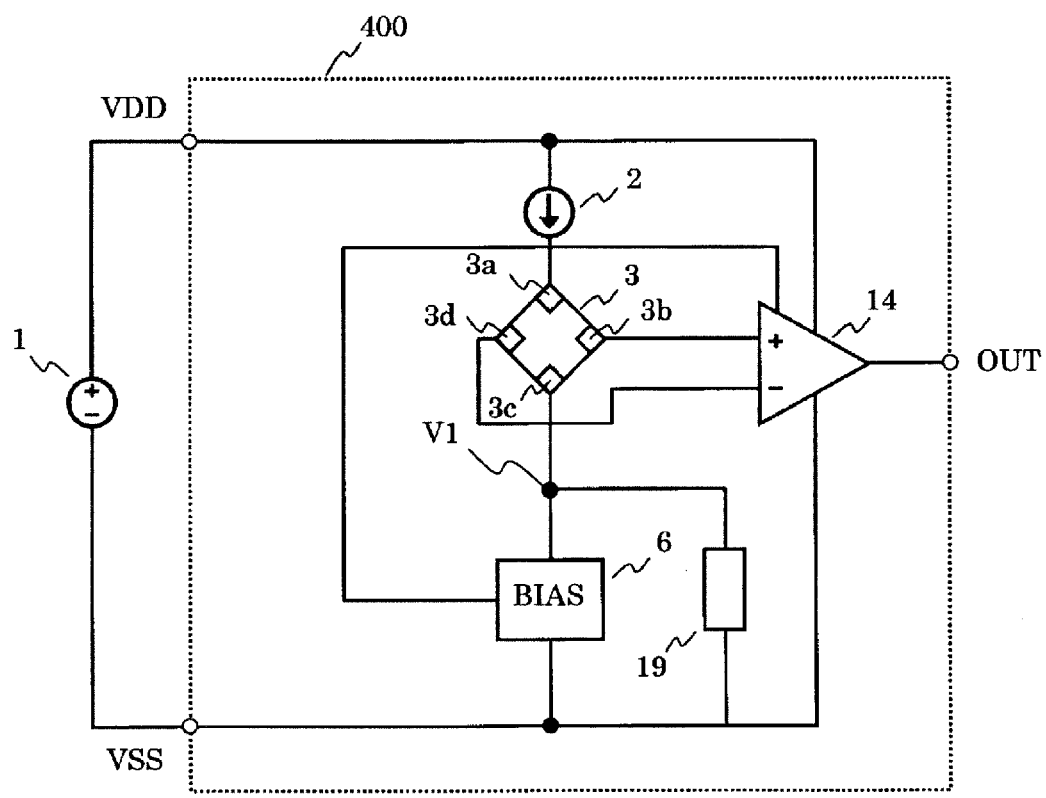
FIG. 4 is a conceptual diagram illustrating a magnetic sensor according to a third embodiment.

FIG. 4 is a conceptual diagram illustrating a third embodiment of a magnetic sensor according to the present invention.

The magnetic sensor 400 according to the third embodiment is equipped with a reference current circuit 6, a shunt 19, and a signal processing circuit 14 instead of the voltage detecting circuit 15, the shunt 9, and the signal processing circuit 4 in the magnetic sensor 300 according to the second embodiment.

The reference current circuit 6 is a circuit which generates a reference current IX3. The reference current IX3 is a reference object for a constant current used in an operational amplifier or the like included in the signal processing circuit 14. The third embodiment is an example in which the reference current circuit 6 is arranged on a current system of a Hall element 3 when the reference current IX3 is relatively large and smaller than a drive current IH of the Hall element 3.

Parts identical in component to the second embodiment are similar in connection relation and operation to the second embodiment.

Of drive electrodes 3a and 3c of the Hall element 3, the drive electrode 3c is connected to a power supply electrode V1 on the positive side of each of the reference current circuit 6 and the shunt 19.

A reference current generated by the reference current circuit 6 is a reference object for a constant current used in the signal processing circuit 14 as described above. After I/V conversion thereof, the I/V-converted bias voltage is inputted to the signal processing circuit 14.

The shunt 19 performs the role of emitting part of the drive current IH of the Hall element 3, which is not consumed in the reference current circuit 6, to a power supply electrode VSS and emits an extra current IZ3 to the power supply electrode VSS.

As described above, in the magnetic sensor 400 with a voltage source 1 as the reference, two systems are provided as main current systems. One of the systems is a system in which a constant current circuit 2 and the Hall element 3 are electrically connected in series, and further a parallel circuit of the reference current circuit 6 and the shunt 19 is connected in series. The current consumption of this system is equal to IH. The other thereof is a system of the signal processing circuit 14. The current consumption of the system is equal to IY. Accordingly, the current consumption of the entire magnetic sensor is equal to IH+IY.

Thus, there can be realized a magnetic sensor which allows a required amount of drive current to flow through the Hall element 3, and reduces the total current consumption without adding the current consumption IX3 of the reference current circuit 6.

Fourth Embodiment

Figure 5:
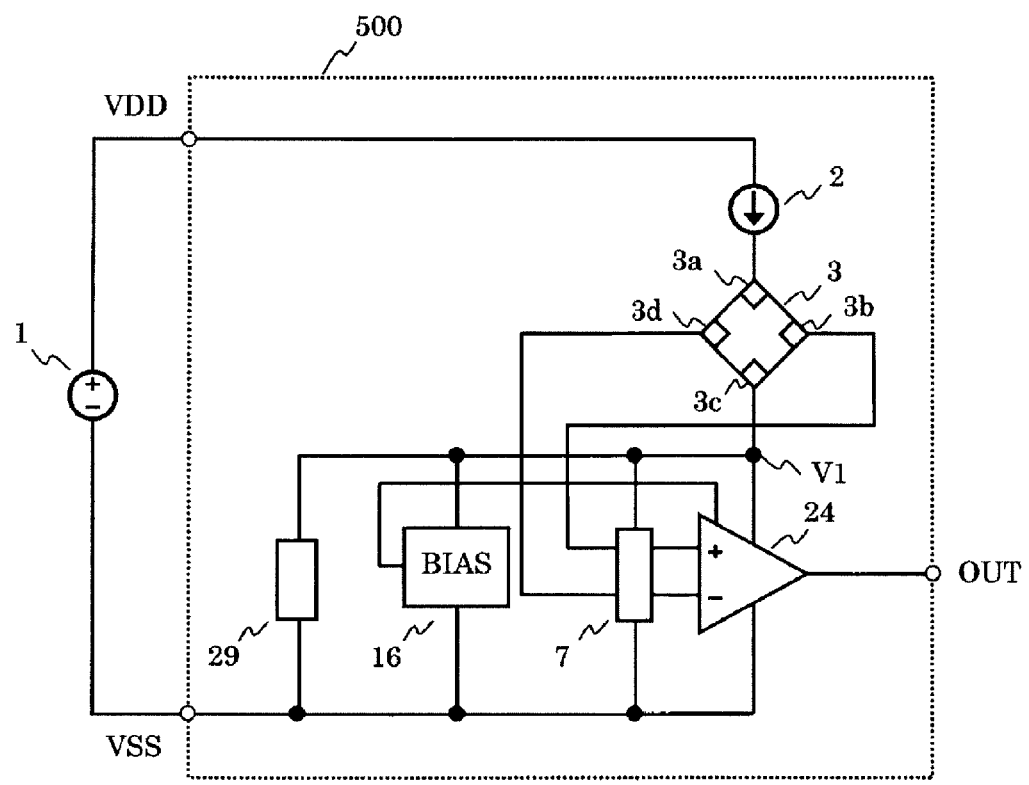
FIG. 5 is a conceptual diagram illustrating a magnetic sensor according to a fourth embodiment.

FIG. 5 is a conceptual diagram illustrating a fourth embodiment of a magnetic sensor according to the present invention.

The magnetic sensor 500 according to the fourth embodiment is an example in which a reference current circuit 16 and a shunt 29, and a signal processing circuit 24 and a level shifter 7 are provided instead of the reference current circuit 6, the shunt 9, and the signal processing circuit 14 in the magnetic sensor 400 according to the third embodiment, and arranged on a current system of a Hall element 3. This is limited to the case where the sum of the current consumption of the reference current circuit 16 and the shunt 29, and the current consumption of the signal processing circuit 24 and the level shifter 7 is smaller than a drive current IH of the Hall element 3.

Parts identical in component to the third embodiment are similar in connection relation and operation to the third embodiment.

Of drive electrodes 3a and 3c of the Hall element 3, the drive electrode 3c is connected to a power supply electrode V1 on the positive side of the reference current circuit 16 and the shunt 29, and the signal processing circuit 24 and the level shifter 7.

An output signal of the Hall element 3 is inputted to the signal processing circuit 24 through the level shifter 7.

The level shifter 7 is a circuit which has two input electrodes and two output electrodes and performs stepdown to a voltage level optimum for a circuit to be connected to the next stage while constantly maintaining a relationship between two voltage values inputted thereto. The output electrodes 3d and 3b of the Hall element 3 are respectively electrically connected to the two input electrodes of the level shifter 7. The two output electrodes of the level shifter 7 are respectively connected to two input electrodes of the next-stage signal processing circuit 24.

The signal processing circuit 24 is a circuit for converting the output signal of the Hall element 3 inputted via the level shifter 7 to a desired electric signal, and is similar in role to other embodiments.

The shunt 29 performs the role of emitting part of the drive current IH of the Hall element 3, which is not consumed in each of the reference current circuit 16, the signal processing circuit 24, and the level shifter 7, to a power supply electrode VSS and emits an extra current to the power supply electrode VSS.

As described above, since a main current system is configured as one system in the magnetic sensor 500 with a voltage source 1 as the reference, the current consumption of the entire magnetic sensor is equal to IH.

Thus, there can be realized a magnetic sensor which allows a required amount of drive current to flow through the Hall element 3, and reduces the total current consumption without adding the current consumptions of other main signal processing circuits 24.

Figure 6:
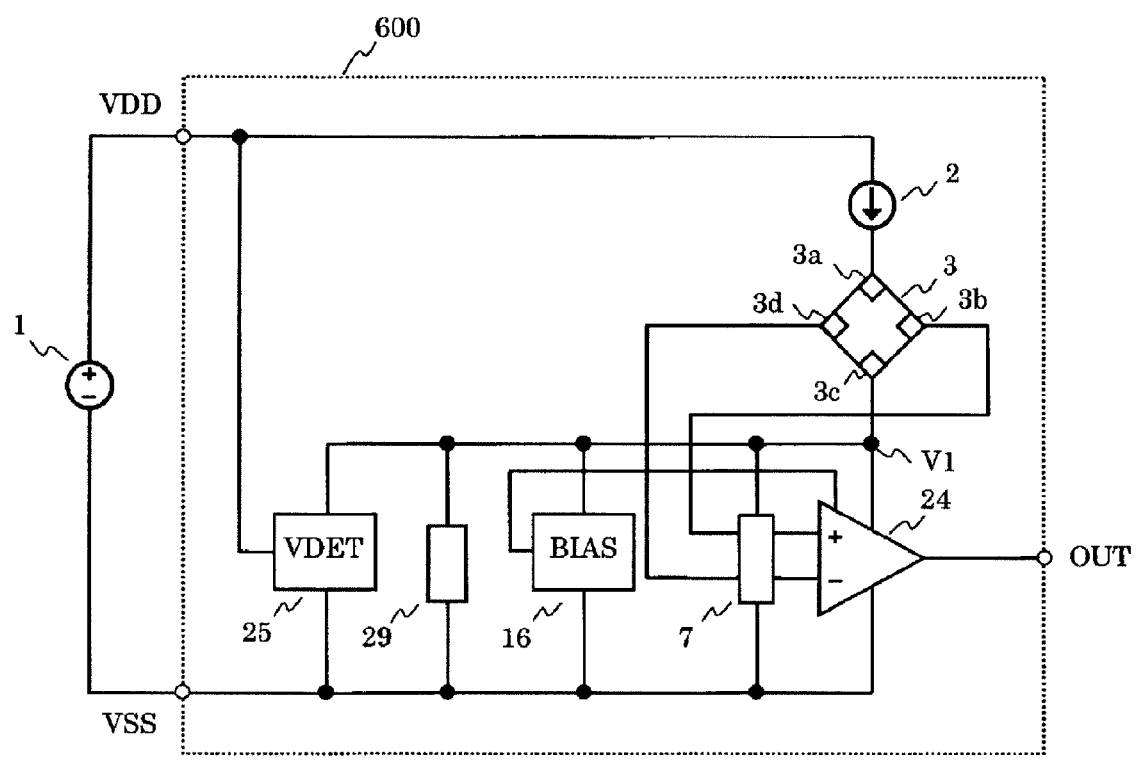
FIG. 6 is a conceptual diagram illustrating another configuration example of the magnetic sensor according to the fourth embodiment.

FIG. 6 is a conceptual diagram illustrating an example where a voltage detecting circuit 25 is connected to the above-described electrode V1 in FIG. 5. An advantageous effect similar to FIG. 5 is obtained by adjusting the amount of current of the shunt 29.

What is claimed is:

1. A magnetic sensor, comprising:
   a magnetoelectric transducing element having first and second drive electrodes, and first and second output electrodes;
   a constant current circuit which supplies a drive current to the first drive electrode of the magnetoelectric transducing element;
   a signal processing circuit which is connected with the first and second output electrodes of the magnetoelectric transducing element and which processes an output signal of the magnetoelectric transducing element;
   a reference current circuit which generates a reference current and supplies an I/V-converted bias voltage to the signal processing circuit; and
   shunt electrically connected in parallel with the reference current circuit,
   said reference current circuit and said shunt are configured as a parallel circuit having a positive-side power supply electrode connected to the second drive electrode of the magnetoelectric transducing element and being electrically connected in series with the constant current circuit and the magnetoelectric transducing element, and
   said signal processing circuit being driven by a voltage source.

2. A magnetic sensor, comprising:
   a magnetoelectric transducing element having first and second drive electrodes, and first and second output electrodes;
   a constant current circuit which supplies a drive current to the first drive electrode of the magnetoelectric transducing element;
   a level shifter which is connected with the first and second output electrodes of the magnetoelectric transducing element and which changes a voltage level of an output signal of the magnetoelectric transducing element and outputs the changed output signal;
   a signal processing circuit which receives the changed output signal of the level shifter and converts the changed output signal into a signal processing circuit output signal;
   a reference current circuit which generates a reference current and supplies an I/V-converted bias voltage to the signal processing circuit; and
   a shunt connected in parallel with the reference current circuit, the level shifter and the signal processing circuit, said reference current circuit, said shunt, said level shifter, and said signal processing circuit each having a positive-side power supply electrode connected to the second drive electrode of the magnetoelectric transducing element, and said reference current circuit, said shunt, said level shifter, and said signal processing circuit are configured as a parallel circuit being electrically connected in series with the constant current circuit and the magnetoelectric transducing element.

3. The magnetic sensor according to claim 2, further comprising a voltage detecting circuit being electrically connected in parallel with the reference current circuit, the shunt, the level shifter, and the signal processing circuit.

* * * * *

UNITED STATES PATENT AND TRADEMARK OFFICE
CERTIFICATE OF CORRECTION

PATENT NO. : 9,810,746 B2
APPLICATION NO. : 14/742940
DATED : November 7, 2017
INVENTOR(S) : Kentaro Fukai et al.

Page 1 of 1

It is certified that error appears in the above-identified patent and that said Letters Patent is hereby corrected as shown below:

In the Claims

Claim 1, Column 6, Line 35: insert --a-- in the beginning of the line

Signed and Sealed this
Twenty-first Day of April, 2020

Andrei Iancu
*Director of the United States Patent and Trademark Office*